United States Patent [19]
Hoffmann

[11] 3,997,881
[45] Dec. 14, 1976

[54] STATIC STORAGE ELEMENT CIRCUIT

[75] Inventor: Kurt Hoffmann, Taufkirchen, Germany

[73] Assignee: Siemens Aktiengesellschaft, Berlin & Munich, Germany

[22] Filed: Sept. 11, 1975

[21] Appl. No.: 612,554

[30] Foreign Application Priority Data

Sept. 26, 1974 Germany .......................... 2446028

[52] U.S. Cl. ..................... 340/173 R; 340/173 FF
[51] Int. Cl.² ..................................... G11C 11/40
[58] Field of Search ... 340/173 R, 173 CA, 173 FF; 307/291, 238

[56] References Cited
OTHER PUBLICATIONS
Müller, NDRO Memory Cell, RCA Technical Notes, TN No. 659, 11/65.

*Primary Examiner*—Stuart N. Hecker
*Attorney, Agent, or Firm*—Hill, Gross, Simpson, Van Santen, Steadman, Chiara & Simpson

[57] ABSTRACT

A static storage element circuit has two pairs of complementary-channel-field effect transistors. A word line and a bit line connect with at least one of the field effect transistors. Connection lines between the field effect transistors create parasitic capacitors for storing charges which control the logic state of the circuit.

6 Claims, 3 Drawing Figures

STATIC STORAGE ELEMENT CIRCUIT

BACKGROUND OF THE INVENTION

1. Field of the Invention

The present invention relates generally to logic storage element circuits and more particularly to storage circuits utilizing field effect transistors.

2. Description of the Prior Art

Static storage element circuits comprising complementary channel MIS field effect transistors (FETs) are shown and described in the publication ISSCC 74/February 15, High-Density ESFI MOS Memory Cells. K. Goser. These are:

a. five transistor circuits with four supply lines and a large area requirement having rapid switching from one logic state into the other;

b. three transistor circuits with four supply lines which can be switched relatively slowly from one logic state into the other due to the use of high ohmic load resistors;

c. Two transistor circuits with a diode and three supply lines which also switch relatively slowly from one logic state into the other since high ohmic load elements are employed.

Thus there are circuits which have a small area requirement but which switch slowly from one logic state into the other. Also, there are circuits which can be switched rapidly from one logic state into the other, but also require a large area space.

SUMMARY OF THE INVENTION

An object of the present invention is to provide a static storage element circuit which is constructed from a total of four transistors.

A further object of this invention is to provide a storage element circuit which switches as quickly from one logic state to another as does a five transistor storage element circuit, but which requires a smaller outlay than this element layout area and which may be designed to require only three supply lines.

The storage element circuit of this invention comprises four interconnected field effect transistors (FETs). A first terminal of a drain-source channel of a first transistor of one conductivity type is connected to a first terminal of a second transistor of opposite channel conductivity, to a gate of a third transistor, and to a gate of a fourth transistor of opposite channel conductivity type. A gate of the second transistor is connected to a first terminal of a drain-source channel of the fourth transistor. A second terminal of the fourth transistor drain-source channel is connected with a first drain-source channel terminal of said third transistor. A gate electrode of the first transistor connects with a word line and a second drain-source channel terminal of the first transistor connects to a bit line. Parasitic capacitors for storing charges are created by connection lines among the four transistors.

DESCRIPTION OF THE PREFERRED EMBODIMENTS

Figure 1:
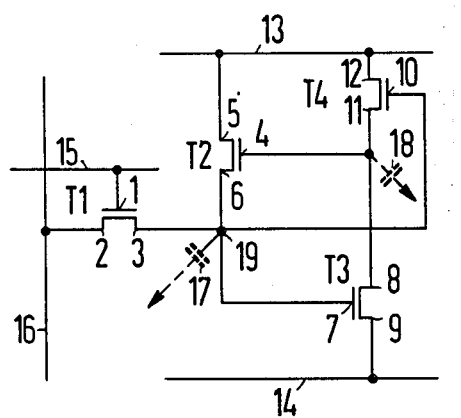
FIG. 1 is a schematic diagram of a storage element circuit in accordance with the invention.

In FIG. 1, the gate electrode of the FET $T_1$ is connected to a word line 15, and the source electrode 2 is connected to a bit line 16. The drain electrode 3 is connected to the drain electrode 6 of an FET $T_2$.

The source electrode 5 of the transistor $T_2$ is connected to a power supply line 13. Between the line 13 and a second reference line 14, an FET $T_4$ and an FET $T_3$ are connected in series i.e. the source electrode 12 of $T_4$ is connected to the first power supply line 13, and the source electrode 9 of $T_3$ is connected to the reference line 14, and the drain electrode 11 of $T_4$ is connected to the drain electrode 8 of $T_4$. The gate electrode 4 of $T_2$ is connected to the drain electrode 11 of $T_4$ and the drain electrode 6 of $T_2$ is connected to the gate electrodes 7 and 10 of the transistors $T_3$ and $T_4$. The transistors $T_1$, $T_3$ and $T_2$, $T_4$ possess the same channel-conductivity type. The capacitors 17 and 18, illustrated by broken lines in FIGS. 1–3, indicate the constantly prevailing line capacitances of the connection lines between the transistors.

The mode of operation of the circuit shown in FIG. 1 will now be explained. It will be assumed that $T_1$ and $T_3$ are n-channel transistors and the transistors $T_2$ and $T_4$ are p-channel transistors. Between the lines 13 and 14 a supply voltage is applied, and the reference line 14 is connected to ground. If the word line is activated and the transistor $T_1$ thus becomes conductive, the corresponding logic state of the bit line is transferred to the parasitic capacitor 17. If this is a logic 1 e.g. if 4 V are connected to 17, the parasitic capacitor 18 is charged to 0 V with the aid of the transistor $T_3$. This results since the transistor $T_2$ becomes conductive and the capacitor 17 is charged to the supply voltage (e.g. 5V). The storage circuit is thus switched into the low-resistance or binary state 1. If a logic 0 is written into the storage circuit, i.e. the capacitor 17 is charged to 0 v from the bit line 16 through $T_1$, the transistor $T_4$ becomes conductive, and the capacitor 18 is charged to the supply voltage, as a result of which the transistor $T_2$ turns off and the voltage of 0 V is retained across the capacitor 17. The storage circuit is in the high resistance or binary state 0.

As the parasitic capacitors 17 and 18 are correspondingly charged by the transistors $T_1$, $T_2$ and $T_4$, $T_3$, the storage circuit can be rapidly switched over from one logic state into the other.

The storage element is read out by activating the corresponding word line and sensing the state of capacitor 17. In the event of a logic 1, the parasitic bit line capacitor 17 is charged by the transistor $T_2$ whereas in the case of a logic 0, no charge takes place since $T_2$ is blocked. If the storage element exhibits the logic state 0, the possibility exists that the capacitor 17 is recharging due to leakage currents of the pn-junction of the transistor $T_2$ and the storage element can assume the wrong logic state. This can be prevented if a compensation current is produced between the connection 19 (FIG. 1) and ground. This current can be produced by the following elements:

a. by a resistor;

b. by a diode in the blocking direction; or c. by a transistor having a small channel length.

A further compensation possibility is obtained by employing the transistor $T_1$ for the production of a compensation current. This can be achieved since during the rest state, i.e. when neither read-out nor write-in is taking place, the bit line is connected to ground or reference potential and the transistor $T_1$ may be provided with a small channel length, as a result of which a compensation current is produced. As an alternative, the word line in the non-activated state may be set to not fall below the threshold voltate $U_T$ of the transistor $T_1$. As a result, a compensation current flows through the transistor to ground.

Figure 2:
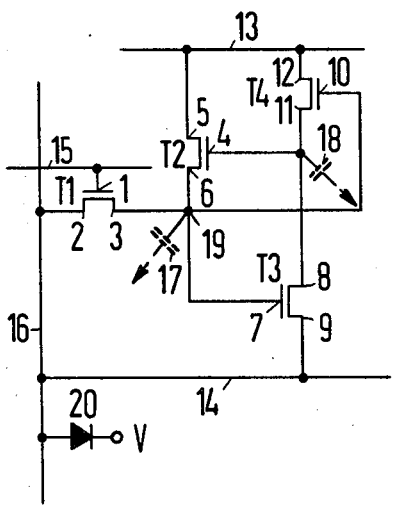
FIG. 2 is a schematic diagram of a modified embodiment of the storage element circuit of FIG. 1.

FIG. 2 illustrates a modification of the circuit shown in FIG. 1. It differs from the circuit illustrated in FIG. 1 since the source electrode 9 of the transistor $T_3$ is connected to the bit line. When the element is in operation, the bit line serves simultaneously as a bit and ground line. For this purpose the bit line is maintained below a potential V (e.g. 2.5 V) with a diode 20 which can be in the form of a MIS transistor, which prevents the static state of the storage element from being dissipated. For example, when a logic 1 is read out, the transistor $T_3$ can charge the parasitic capacitor 18 to such an extent that the transistor $T_2$ switches off.

Figure 3:
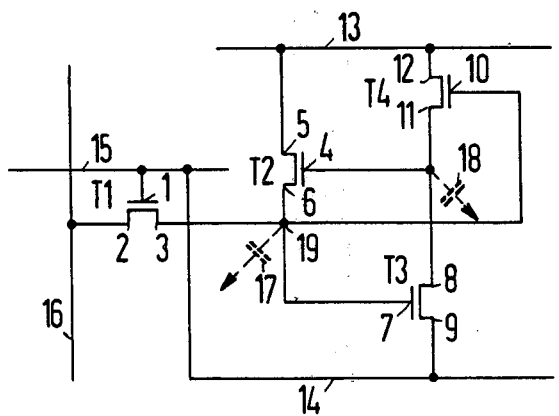
FIG. 3 is a schematic diagram of another modified embodiment of the storage element circuit of FIG. 1.

FIG. 3 illustrates a second modification of the circuit in FIG. 1. It differs from the circuits described above in that the source electrode 9 of $T_3$ is connected to the word line 15. The word line 15 is for this purpose simultaneously used as a word and ground line. In the activated state, the word line 15 thereby assumes a potential which maintains the static state of the storage element. With a supply voltage of 5 V, and a starting voltage of the transistors of 1 V, the word line voltage is approximately 2.5 V.

In the circuits of FIGS. 1, 2, and 3 described above, FET source electrode connections may be substituted for all drain electrode connections if all FET drain electrode connections are substituted for all source electrode connections.

Although various minor modifications may be suggested by those versed in the art, it should be understood that I wish to embody within the scope of the patent warranted hereon, all such embodiments as reasonably and properly come within the scope of my contribution to the art.

I claim as my invention:
1. A static storage element circuit comprising:
    a. first, second, third and fourth field effect transistors (FETs) each having a gate terminal and a drain-source channel with first and second channel terminals, said first and third FETs having a first conductivity type channel and said second and fourth FETs being of opposite conductivity to the first and third FET channels,
        i. the first channel terminal of the first FET being connected to the first channel terminal of the second FET, to the gate terminal of the third FET, and to the gate terminal of the fourth FET,
        ii. the gate terminal of the second FET being connected to the first channel terminal of the fourth FET, and
        iii. the first channel terminal of the fourth FET being connected to the second channel terminal of the third FET;
    b. a word line connected to the gate terminal of the first FET; and
    c. a bit line connected to the second channel terminal of the first FET.
2. A storage element circuit as claimed in claim 1, in which the first channel terminal of the third FET is connected to the bit line.
3. A storage element circuit as claimed in claim 1, in which the first channel terminal of the third FET is connected to the word line.
4. A static storage element circuit comprising:
    a. first, second, third and fourth field effect transistors (FETs) each having a gate terminal and a drain-source channel with first and second channel terminals, said first and third FETs having a first conductivity type channel and said second and fourth FETs being of opposite conductivity to the first and third FET channels,
        i. the first channel terminal of the first FET being connected to the first channel terminal of the second FET, to the gate terminal of the third FET, and to the gate terminal of the fourth FET,
        ii. the gate terminal of the second FET being connected to the first channel terminal of the fourth FET, and
        iii. the first channel terminal of the fourth FET being connected to the second channel terminal of the third FET;
    b. a word line connected to the gate terminal of the first FET;
    c. a bit line connected to the second channel terminal of the first FET;
    d. a first parasitic capacitor being formed at connection lines between the first FET, first channel terminal, second FET first channel terminal, fourth FET gate terminal, and third FET gate terminal;
    e. a second parasitic capacitor being formed at connection lines between the third FET second channel terminal, fourth FET first channel terminal, and second FET gate terminal;
    f. a power supply line connected to the second and fourth FET second channel terminals; and
    g. a reference line connected to the third FET first channel terminal.
5. A storage element circuit of claim 4 in which said reference line also connects to said bit line.
6. A storage element circuit of claim 4 in which said reference line also connects to said word line.

* * * * *